United States Patent
Finley

(10) Patent No.: US 7,355,320 B2
(45) Date of Patent: Apr. 8, 2008

(54) REACTIVE LOAD RESONANT DRIVE CIRCUIT

(75) Inventor: Kenneth W. Finley, Mead, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 286 days.

(21) Appl. No.: 10/985,775

(22) Filed: Nov. 10, 2004

(65) Prior Publication Data

US 2006/0113864 A1    Jun. 1, 2006

(51) Int. Cl.
*H01L 41/08* (2006.01)
(52) U.S. Cl. .................................... 310/316
(58) Field of Classification Search ............... 310/316, 310/317, 316.01, 323.02, 323.01, 316.03, 310/319; 137/8
See application file for complete search history.

(56) References Cited

U.S. PATENT DOCUMENTS

| | | |
|---|---|---|
| 4,608,958 A | 9/1986 | Sakakibara et al. |
| 4,658,155 A | 4/1987 | Ohba et al. |
| 4,841,191 A | 6/1989 | Takada et al. |
| 4,977,916 A * | 12/1990 | Ohmi et al. .................. 137/8 |
| 5,208,505 A * | 5/1993 | Mitsuyasu .................. 310/317 |
| 5,361,014 A | 11/1994 | Antone et al. |
| 5,543,679 A * | 8/1996 | Morino et al. ......... 310/316.03 |
| 6,062,256 A | 5/2000 | Miller et al. |
| 6,095,175 A | 8/2000 | Miller et al. |
| 6,204,811 B1 | 3/2001 | Phillips |
| 6,246,152 B1 | 6/2001 | Fontanella et al. |
| 6,320,297 B1 * | 11/2001 | Gurich et al. .......... 310/316.03 |
| 6,411,009 B2 | 6/2002 | Jaenker |
| 6,617,755 B2 | 9/2003 | Kawamoto |
| 2003/0094882 A1 | 5/2003 | Mizuuchi |

* cited by examiner

Primary Examiner—Darren Schuberg
Assistant Examiner—Karen Addison

(57) ABSTRACT

Energy efficient circuitry is provided for rapid transfer of charge to and from a reactive load while avoiding excessive peak currents and significant resistive energy dissipation. For example, circuitry of the invention provides for rapid actuation of a piezoelectric mass flow valve actuator while significantly reducing electrical input power and power dissipation requirements. The invention also features circuitry for recovering a substantial portion of the energy delivered to the reactive load while still permitting rapid cycling of the load drive circuit. Controlling the activation interval of the drive circuitry provides for incremental actuation or positioning of the reactive load.

29 Claims, 5 Drawing Sheets

REACTIVE LOAD RESONANT DRIVE CIRCUIT

BACKGROUND OF THE INVENTION

1. Field of the Invention

This invention relates generally to electrical control of a reactive load, and more particularly to high speed, low loss control of a piezoelectric actuator or other electromechanical positioning device.

2. Brief Description of the Prior Art

A piezoelectric linear actuator is a nano-positioning device that deforms its shape in response to a stimulus of electrical charge. Piezoelectric actuators are used to operate mechanical valves that regulate the flow of materials in such diverse applications as automobile fuel injectors, hydraulic servovalves, and ink jet printer nozzles. Piezoelectric linear actuators are particularly well suited for use in mass flow controller products, such as those employed in connection with plasma processing equipment, because the actuators can be operated for billions of cycles with virtually no loss in performance. Compared to other electromechanical actuators such as solenoids or stepper motors of comparable size and cost, piezoelectric actuators are capable of providing significantly greater actuating forces per unit of input energy provided, along with exceptional positional accuracy.

In gas delivery applications, particularly those involving high-speed processes, the time required to actuate a control valve can directly affect the performance of a mass flow controller. A typical mass flow controller product stimulates a piezoelectric actuator by transferring charge from a power source to the actuator load using a first-order circuit arrangement. In this approach, a resistive element controls the peak current value (i.e., initial charge transfer) into the capacitive actuator load and participates in an exponential decay rate time constant. The current waveform resulting from a first-order drive circuit is an initially large peak current, followed by a long exponential decay period during which most of the charge is transferred to the actuator. Charge transfer rate can be increased by increasing the peak current. The speed of charge transfer is limited, however, by peak current stresses placed on the internal bond wires connecting the drive circuit to the piezoelectric actuator, as well as by practical considerations of the cost, size, and electrical isolation of high-current switches and other components. As a result, contemporary mass flow controller devices tend to have relatively slow actuation times on the order of several hundred milliseconds. For many process applications, these actuation times impose an undesirable lower limit on the open time of the flow path, or upper limit on the repetition rate at which the controller may be operated.

The amount of electrical power consumed and dissipated by a mass flow controller may also limit its suitability for many process applications. In stimulating a piezoelectric actuator with a first-order drive circuit, half of the energy provided by the power source is always dissipated in the series resistive element. Moreover, the energy used to charge the piezoelectric actuator is typically not recovered, thus requiring dissipation of that stored energy when the actuator is discharged. As a result, power consumption and dissipation needs of a high-speed mass flow controller may become unacceptably high in a system environment where power and heat sinking resources are allocated sparingly.

U.S. Pat. No. 6,320,297 describes a circuit for controlling a piezoelectric actuator with reduced electrical losses. The capacitive actuator load is charged from a capacitor bank through a load switch and a series reactance coil. To discharge the actuator, a discharge switch is closed, causing reverse current to flow from the actuator through the reactance coil. When the actuator voltage has dropped to the residual voltage of the capacitor bank, a residual discharge switch is closed, causing additional reverse current to flow in the reactance coil. The residual discharge switch must then be opened at the moment when the current in the reactance coil is at a maximum in order to release the residual energy previously stored in the actuator load back into the capacitor bank.

As an alternative to in-line mass flow control, a mass flow diverter may be employed in applications requiring higher speed control of minute feed gas quantities. In this approach, a pneumatically actuated valve is located on a gas stream conduit venting continuously from a source. To inject a quantity of gas into a process, the valve is driven rapidly to a position that diverts the stream into the process environment, and then returned rapidly to the venting position. Use of high-speed pneumatics to drive the diverter valve allows for short actuation times, on the order of tens of milliseconds, and therefore greater control over the delivered gas quantity. In addition to the added cost and complexity of this approach, however, a significant disadvantage is that the vented material often cannot be recovered due to contamination concerns. For many processes, particular in the manufacture of semiconductor devices, this can result in significant waste of expensive feed gas materials along with an attendant need for scrubbing or abating greater quantities of the gases downstream of the process.

It would be desirable to provide circuitry capable of rapidly actuating a piezoelectric or other reactive load without driving excessively large peak currents through the elements and connections of the circuitry. It would be further desirable to provide for rapid actuation of a reactive load while minimizing input power and heat sinking requirements. It would be further desirable to provide for partial actuation of a reactive load, such as a positioning device, in order to achieve incremental positioning of the load.

SUMMARY OF THE INVENTION

This invention provides energy efficient circuitry for rapid transfer of charge to and from a reactive load. The invention generally comprises a resonant drive circuit for rapidly transferring charge to a reactive load while avoiding excessive peak currents and significant resistive energy dissipation. The invention also features circuitry for recovering a substantial portion of the energy delivered to the reactive load while still permitting rapid cycling of the load drive circuit.

In one embodiment of the invention, a resonant drive circuit comprises a piezoelectric actuator and a series inductive element for rapid delivery of charge from a voltage source to the capacitive actuator load. A semiconductor switch controls the application of voltage to the circuit from a voltage source, and a series diode rectifies the resonant current waveform of the circuit for positive charge transfer to the actuator. The resonant drive circuit is optimized for rapid transfer of charge from the voltage source to the piezoelectric actuator with minimal peak currents. The switched circuit arrangement also allows the piezoelectric actuator to be driven affirmatively to a known voltage reference while naturally locating and managing zero-voltage crossings within the circuit for effective charging and discharging of the actuator device.

In one embodiment of the invention, an energy conserving discharge circuit is provided in addition to a resonant drive circuit. A semiconductor switch creates a single-stage resonant discharge path from the piezoelectric actuator through the inductive element of a resonant drive circuit. The discharge circuit further comprises nonlinear elements to ensure rapid and positive transfer of charge from the actuator. Energy recovered by the discharge circuit is returned to the power source of the actuator drive circuit. The resonant discharge circuit is optimized so as to recover and recycle a substantial portion of the energy delivered to the reactive load without unduly limiting the cycling frequency of the load drive circuit.

The invention provides for increased speed and energy efficiency of circuitry used to control operation of reactive loads. For example, the circuitry of the invention permits the speed at which a piezoelectric linear actuator can operate a mechanical valve to be increased several fold while significantly reducing electrical input power and power dissipation requirements. Proper selection of the resonant elements of the drive circuit ensures that charge is transferred to the reactive load within actuation time limits and peak current limits of the circuit. Transferring an electrical charge using resonant drive circuitry of the invention provides for nearly all of the source energy to be delivered to the reactive load, allowing for further reductions in electrical power requirements.

In a further embodiment of the invention, the activation period of a semiconductor switch controls the actuation increment of a piezoelectric device or other reactive load. A resonant drive circuit comprises a piezoelectric actuator and a series inductive element together with nonlinear devices that ensure rapid and positive delivery of charge from a voltage source to the actuator load. Control of the activation ("on") time of the semiconductor switch results in a variable quantity of electrical charge delivered through the resonant circuit, thus providing for incremental actuation of the piezoelectric load.

DETAILED DESCRIPTION

Figure 1:
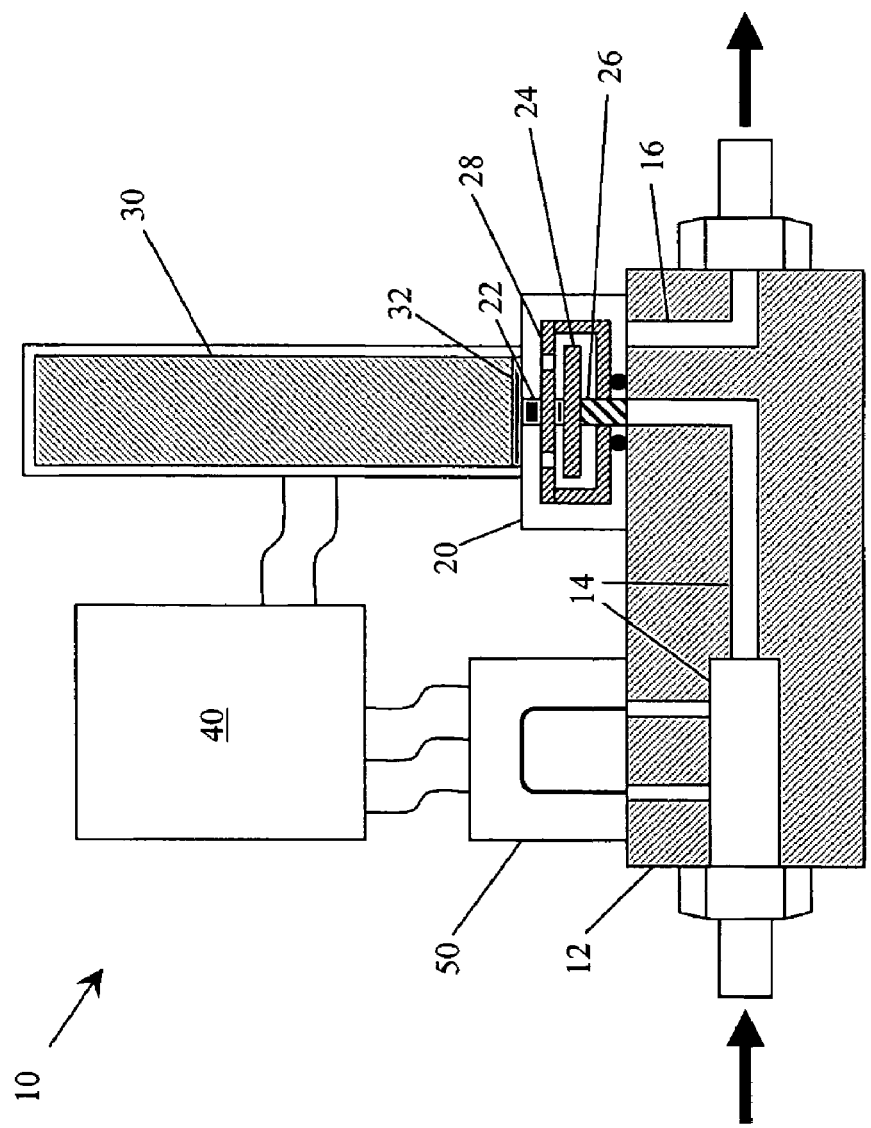
FIG. 1 illustrates a mass flow controller device in accordance with an embodiment of the invention.

FIG. 1 illustrates one embodiment of a mass flow controller device that incorporates features of the invention. Mass flow controller 10 comprises controller base 12 having upstream and downstream gas flow passages 14 and 16, respectively. Gas flow between passages 14 and 16 is controlled by valve assembly 20. When actuated, piezoelectric stack 30 transmits force through diaphragm 32 and plunger 22 to poppet 24, which opposes the force of spring 26 to create a gas flow path through orifice plate 28. Actuation of piezoelectric stack 30 is controlled by drive circuitry on electronics board 40. A sensor loop 50 provides measurements of properties of the gas stream flow to control electronics on electronics board 40.

Figure 2:
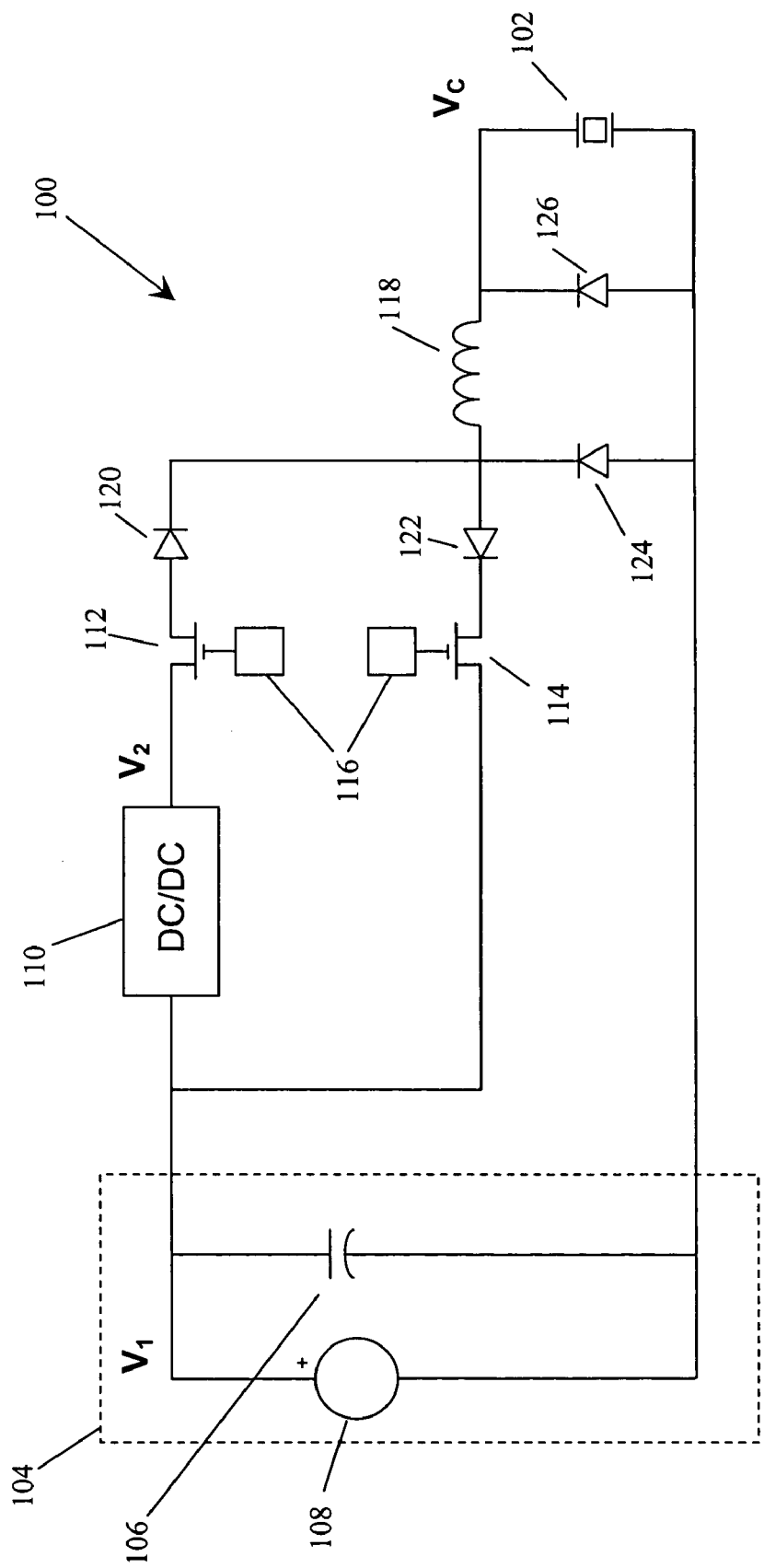
FIG. 2 illustrates circuitry for driving a reactive load in accordance with one embodiment of the invention.

FIG. 2 illustrates actuation circuitry in accordance with one embodiment of the invention. Circuit 100 drives a piezoelectric actuator 102 depicted as a capacitive load. Circuit 100 further comprises low voltage source 104 providing DC power at voltage $V_1$ and step-up converter 110 that boosts $V_1$ to DC voltage $V_2$. Charging switch 112 controls the charging of actuator 102 through series inductor 118 and diodes 120 and 124, and discharge switch 114 controls discharging of the actuator through inductor 118 and diodes 122 and 126.

To charge the piezoelectric actuator, charging switch 112 is closed, connecting the resonant circuit comprising inductor 118 and actuator 102 to voltage $V_2$ provided by step-up converter 110. A positive current waveform is initiated having a periodicity at the natural frequency of the resonant circuit formed by inductor 118 and capacitive actuator load 102. In the case of the embodiment illustrated in FIG. 2, the underdamped second-order circuit arrangement results in a current flow in the form of an exponentially decaying sine function. When the voltage across the actuator load 102 reaches $V_2$, diode 120 turns off and diode 124 becomes conductive to permit the remaining energy that has become stored in inductor 118 to be delivered into the actuator load 102. Thus, when the current waveform reaches zero after the first half-cycle of the sine function, all charge has been delivered to the actuator load 102 at voltage $V_C$. Diodes 120 and 124 rectify the current waveform in the resonant charging circuit to prevent reverse current flow from actuator 102. During the charging cycle, discharging switch 114 remains open.

Inductor 118 is selected to have an inductance that optimizes the rate of charge transfer to actuator 102. In the case of a mass flow controller, for example, improving the actuation time of a piezoelectric valve actuator allows for greater control over the open time of the flow path and operation of the controller at a higher repetition rate. In general, a lower value of inductance results in a higher natural frequency of the resonant circuit comprising inductor 118 and actuator 102. A circuit having a higher natural frequency delivers charge to the actuator more rapidly, but with a higher value of peak current. Proper selection of the reactive value of the series resonant elements of the circuit ensures that charge is transferred to the load within a desired actuation time limit and peak current limits of the circuit. Thus, an inductance value is chosen that optimizes the speed of charge transfer to actuator 102 while preventing the charging currents from exceeding limits imposed by electrical and physical constraints of circuit elements and connections. The optimal speed of charge transfer is also determined based upon mechanical actuation limitations that may be characteristic of the piezoelectric device itself. It will be appreciated that the function of inductor 118 may be implemented using alternative circuit elements that mimic the properties of inductors, such as negative-impedance converters or gyrators, or by making use of the inductive properties of other circuit elements, such as the leakage inductance of a transformer.

Figure 3:
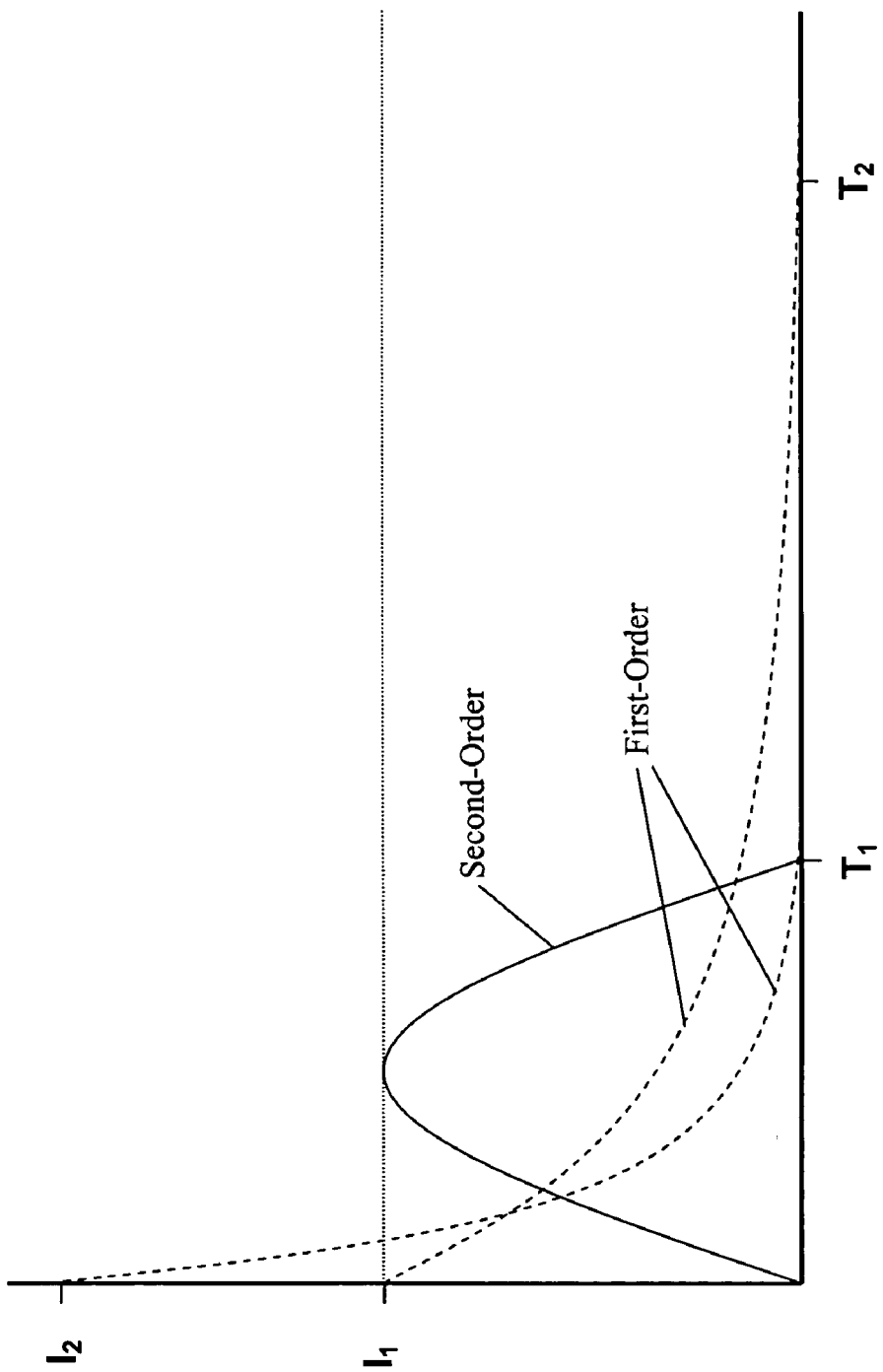
FIG. 3 illustrates a charging waveform response in accordance with one embodiment of the invention.

FIG. 3 illustrates advantages of a charging circuit of one embodiment of the invention over a first-order charging circuit arrangement. The second-order charging circuit of the invention results in a sinusoidal current waveform that delivers a full charge to a reactive load at time $T_1$ with peak current $I_1$. By comparison, a first-order charging circuit that delivers a full charge at time $T_1$ imposes a considerably higher peak current $I_2$ on the charging circuit. Alternatively, a first-order charging circuit that is restricted to a peak current value of $I_1$ requires a considerably longer time $T_2$ to deliver a full charge to the load.

To discharge the piezoelectric actuator, charging switch 112 depicted in FIG. 2 is opened and discharging switch 114 is closed, causing reverse current to flow from load 102 through series inductor 118. Due again to the low-loss second-order circuit arrangement of the discharge path, the current waveform is an underdamped sine function. When the voltage across the actuator load 102 reaches zero, diode 126 becomes conductive to prevent further current flow from the load that would drive the actuator voltage negative, while permitting the energy that has become stored in inductor 118 to discharge into energy storage element 106 of low voltage source 104. Series diode 122 rectifies the current waveform in the resonant discharging circuit to prevent forward current flow back into actuator 102.

The efficiency and rate of energy discharge from inductor 118 to storage element 106 is determined by ohmic losses present in the discharge path. Ideally, energy in inductor 118 is discharged rapidly so as to readily permit the inductor to participate in a next charging cycle of actuator 102. Non-ideal behaviors of the elements of the discharge circuit, however, may result in a cumulative circuit resistance that dissipates energy and lengthens the discharge time constant of the circuit, thereby impeding transfer of the energy in inductor 118. In this case, energy recovery may be improved and the discharge time shortened by terminating the discharge path into a bias voltage. In the embodiment illustrated in FIG. 2, storage element 106 is disposed within low voltage source 104 that provides a constant DC voltage $V_1$. As a result, when discharging switch 144 is closed to discharge actuator load 102, the reduced potential between the charged actuator voltage and $V_1$ causes current through inductor 118 to build at a reduced rate. When the actuator voltage falls to $V_1$, current through inductor 118 begins to decrease. When the actuator is completely discharged, parallel diode 126 becomes conductive, allowing the energy stored in inductor 118 to discharge into energy storage element 106 of low voltage source 104. Because the energy storage element is biased at voltage $V_1$, however, the current present in inductor 118 rapidly decays to zero, as compared to the longer time that would be required for the current to decay to ground potential. Thus, providing bias voltage $V_1$ in the discharge path allows inductor 118 to be discharged rapidly, which in turn permits rapid cycling between charging and discharging of actuator 102. The presence of bias voltage $V_1$ also serves to lower the peak value of currents that develop during the discharging cycle, thus reducing ohmic dissipation in the discharge circuit and increasing energy recovery.

In the embodiment of FIG. 2, charging and discharging switches 112 and 114 are illustrated as MOSFET semiconductor devices activated by driving circuits 116. Due to their rapid activation times and low "on" resistance, the use of MOSFET devices as switches is advantageous in many applications. It will be understood, however, that switching devices of the invention may alternatively include other semiconductor devices such as IGBTs or thyristors, relays, or any switching devices appropriate to the circuitry and application of the invention. It will also be appreciated that while charging switch 112 provides a step function of voltage to the resonant charging circuit depicted in FIG. 2, the switching devices of the invention may also be operated so as to provide a voltage ramp, for example, or any input voltage or current waveform appropriate to the particular application.

FIG. 2 further illustrates how the invention may be practiced without the need for precise timing of the activation and deactivation times of switching devices that control the charging and discharging functions of the driving circuitry. In the embodiment shown in FIG. 2, each of switches 112 and 114 is closed for a time interval sufficient to complete the respective charging or discharging operation controlled by the switch, and need only be opened at some time prior to the initiation of the next half-cycle controlled by the opposing switch.

In the embodiment of FIG. 2, a second-order resonant circuit arrangement results in a sinusoidal current waveform that delivers charge to the reactive load. Embodiments of the invention also include circuitry that produces current waveforms having harmonic components of a fundamental resonant frequency for improved charge transfer. For example, a current waveform comprising the third harmonic of a resonant frequency in addition to fundamental frequency itself more closely approximates a square wave or step function, which for a given maximum current value yields an even more rapid transfer of charge from a voltage source to a load.

Figure 4:
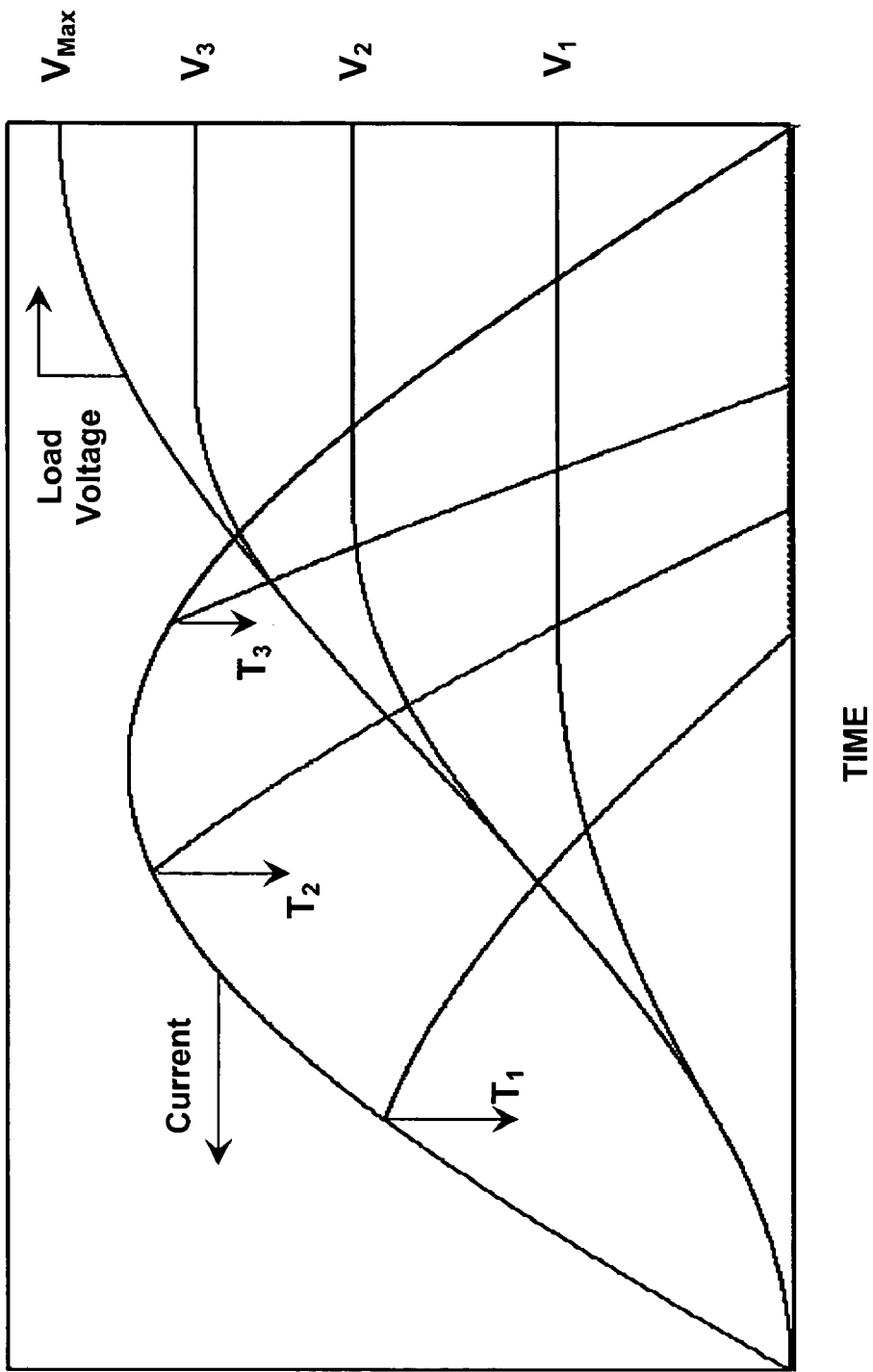
FIG. 4 illustrates incremental charging waveform responses in accordance with alternative embodiments of the invention.

In an alternative embodiment of the invention, charging circuitry provides for incremental delivery of energy to a reactive load. Referring to the circuit architecture of FIG. 1, the drive circuit 116 of charging switch 112 in this alternative embodiment is configured to allow charting switch 112 to be closed for an arbitrary time interval. To charge the piezoelectric actuator, charging switch 112 is closed, which connects the resonant circuit comprising inductor 118 and actuator 102 to voltage $V_2$ provided by voltage converter 110. A positive current waveform is initiated having a periodicity at the natural frequency of the resonant circuit formed by inductor 118 and capacitive actuator load 102. Before the current waveform reaches zero, however, at which point full charge would be delivered to load 102, switch 112 is opened. Parallel diode 124 becomes conductive, allowing energy stored in inductor 118 to be delivered to load 102. When the freewheeling current waveform through parallel diode 124 and inductor 118 reaches zero, an incremental charge has been delivered to load 102 resulting in a voltage across the load that varies depending upon the actuation time of switch 112. As shown in FIG. 4, for example, if switch 112 is closed at time $T_1$, $T_2$, or $T_3$, corresponding voltage $V_1$, $V_2$, or $V_3$, respectively, will appear across the load. Series diode 120 prevents reverse current flow from actuator 102. In this way, incremental positioning of a piezoelectric actuator is accomplished by controlling the activation time of charging switch 112. Depending upon the voltage available from voltage converter 110, an incrementally actuated piezoelectric actuator may be further incrementally actuated by additional activation of switch 112, or the actuator load may be discharged through a discharging circuit and reactuated to a new position by activation of switch 112 for a correspondingly different time interval.

In one embodiment of the invention, a mass flow controller device comprises a gas valve controlled by a piezoelectric actuator that is capable of being incrementally actuated. One or more properties of the gas stream are sensed and used to control the position of the valve to regulate the gas stream to a desired mass flow set point.

Figure 5:
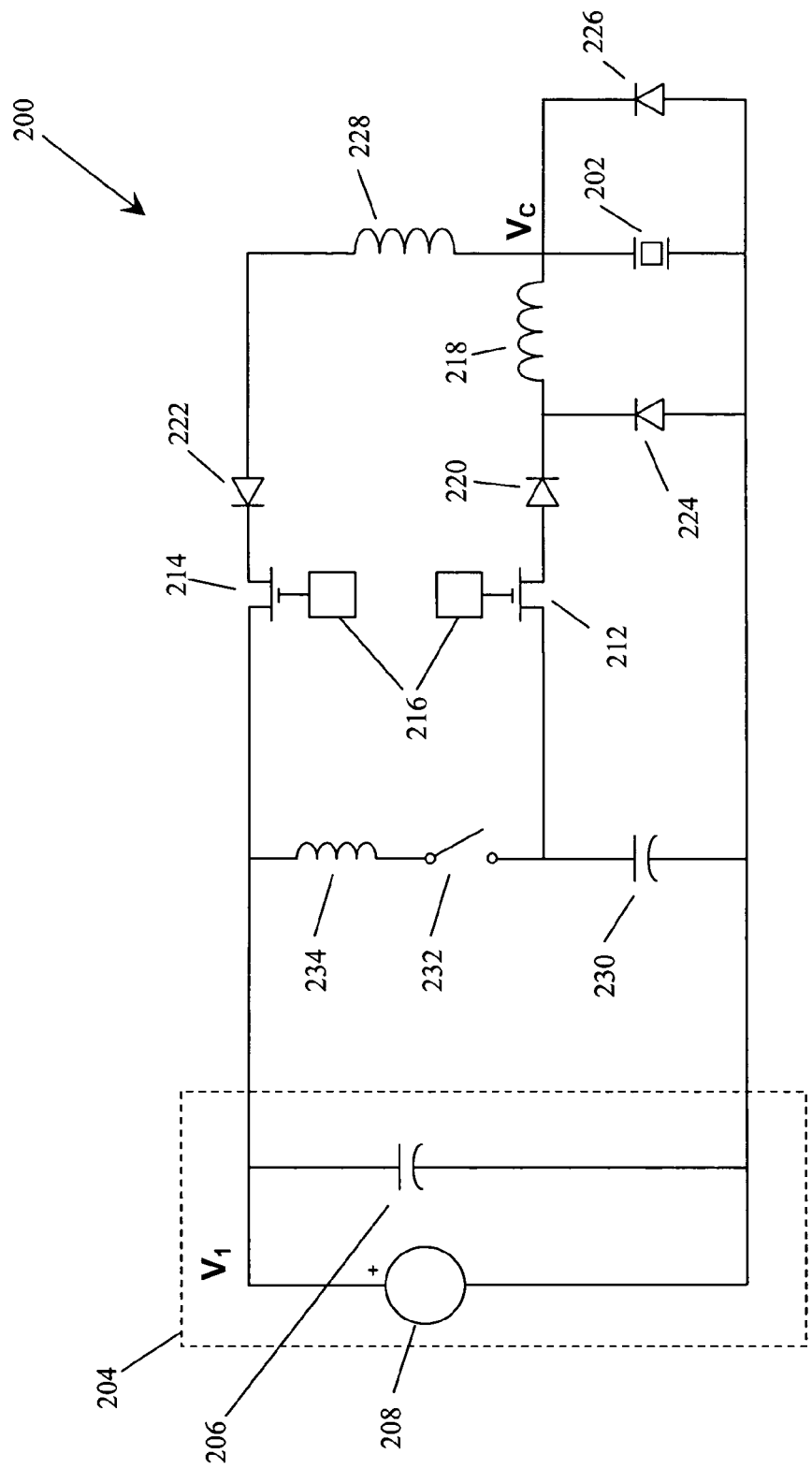
FIG. 5 illustrates circuitry for driving a reactive load in accordance with an alternative embodiment of the invention.

A drive circuit arrangement in accordance with an alternative embodiment of the invention is illustrated in FIG. 5. Circuit 200 controls charging and discharging of a piezoelectric actuator 202 through switches 212 and discharge switch 214. Voltage source 204 provides DC power at voltage $V_1$ for charging of storage capacitor 230 through switch 232 and charging inductor 234. To charge actuator 202, charging switch 212 is closed, connecting the resonant circuit comprising first resonant inductor 218 and actuator 202 to storage capacitor 230. First resonant inductor 218 is selected to have an inductance that optimizes the rate of charge transfer to actuator 202, such that charge is transferred to the load within a desired actuation time limit and peak current limits of the circuit. Storage capacitor 230 is selected to have a capacitance such that energy stored therein at voltage $V_1$ results in a desired voltage $V_C$ across the piezoelectric actuator 202 when charge transfer is complete. Diodes 220 and 224 rectify the current waveform in the resonant charging circuit to prevent reverse current flow from actuator 202. To discharge the piezoelectric actuator, charging switch 212 is opened and discharging switch 214 is closed, causing reverse current to flow from load 202 through second resonant inductor 228 and into energy storage element 206 of voltage source 204. Second resonant inductor 228 is selected to have an inductance that optimizes the discharge time constant from actuator 202, which may be a different from the charging time constant as determined by first resonant inductor 218. Series diode 222 rectifies the current waveform in the resonant discharging circuit to prevent forward current flow back into actuator 202. Switch 232 is actuated as needed to recharge storage capacitor 230 in preparation for another charging cycle of load 202.

In the foregoing, embodiments of the invention have been described for charging and discharging piezoelectric actuator loads, which may include linear, tube, disk, or bimorph/polymorph actuators, as well as ultrasonic micromotors or inchworm actuators. The piezoelectric actuator may be used to operate a mechanical valve of a mass flow controller, flow shut-off device, flow pressure regulator device, or for any other purpose. Circuitry of the invention is also useful for rapidly actuating other types of reactive loads such as shape memory, electromagnetic, polymer, or magnetostrictive actuators; piezoelectric transformers, micro pumps or radial field diaphragms; solenoid or voice coil actuators; or stepper motors.

Although specific structure and details of operation are illustrated and described herein, it is to be understood that these descriptions are exemplary and that alternative embodiments and equivalents may be readily made by those skilled in the art without departing from the spirit and the scope of this invention. Accordingly, the invention is intended to embrace all such alternatives and equivalents that fall within the spirit and scope of the appended claims.

What is claimed is:

1. A circuit for driving an electrically reactive load, comprising:
   a) a voltage source;
   b) a resonant circuit comprising a reactive load and at least one reactive element in series with the reactive load; and
   c) a first switching device disposed between the voltage source and the resonant circuit such that activation of the first switching device initiates a resonant current waveform in the resonant circuit;
   d) a drive circuit configured to both, activate the first switching device to initiate the resonant current waveform and to open the first switching device before the resonant current waveform reaches zero so as to enable an increment charge to be delivered to the reactive element, wherein the amount of incremental charge delivered to the reactive load is a function of an amount of time the first switching device is activated.

2. The circuit of claim 1 wherein the reactive load is a piezoelectric actuator.

3. The circuit of claim 1 wherein the at least one reactive element is an inductor.

4. The circuit of claim 1 wherein the resonant circuit is a second order circuit.

5. The circuit of claim 1 wherein the resonant circuit further comprises rectifying elements that prevent reverse current flow from the reactive load.

6. The circuit of claim 1, further comprising a second switching device disposed between the resonant circuit and an energy storage element and wherein activation of the second switching device discharges at least part of the charge stored in the reactive load into the energy storage element.

7. The circuit of claim 6 wherein the energy storage element is maintained at a bias voltage.

8. The circuit of claim 7 wherein the energy storage element is a storage capacitor of the voltage source.

9. The circuit of claim 6 wherein the first switching device and the second switching device are field effect transistors.

10. The mass flow controller, comprising:
    a) an upstream gas flow passage;
    b) a gas flow valve disposed between the upstream gas flow passage and a downstream gas flow passage, the position of the gas flow valve controlling gas flow between the upstream gas flow passage and the downstream gas flow passage;
    c) a piezoelectric actuator that controls the position of the gas flow valve; and
    d) a drive circuit for driving the piezoelectric actuator, the drive circuit comprising a voltage source, a resonant circuit comprising at least one inductive element in series with the piezoelectric actuator, and a first switching device disposed between the voltage source and the resonant circuit such that activation of the first switching device initiates a resonant current waveform in the resonant circuit, wherein the drive circuit is configured to both, activate the first switching device to initiate the resonant current waveform and to open the first switching device before the resonant current waveform reaches zero so as to enable incremental positioning of the piezoelectric actuator.

11. The apparatus of claim 10 wherein the resonant circuit is a second order circuit.

12. The apparatus of claim 10 wherein the resonant circuit further comprises rectifying elements that prevent reverse current flow from the reactive load.

13. The apparatus of claim 10 wherein at least one property of the gas flow is sensed and used to control the incremental actuation of the piezoelectric actuator for regulation of the gas flow to a set point.

14. The apparatus of claim 10, further comprising a second switching device disposed between the resonant circuit and an energy storage element and wherein activation of the second switching device discharges at least part of the charge stored in the reactive load into the energy storage element.

15. The apparatus of claim 14 wherein the energy storage element is maintained at a bias voltage.

16. The apparatus of claim 15 wherein the energy storage element is a storage capacitor of the voltage source.

17. A method of driving an electrically reactive load, comprising:
    a) providing a drive circuit comprising a voltage source, a resonant circuit comprising at least one reactive element in series with a reactive load, and a first switching device disposed between the voltage source and the resonant circuit; and b) initiating a resonant current waveform in the resonant circuit by activating the first switching device;

c) opening, in advance of the resonant current waveform reaching zero, the first switching device so as to enable an increment charge to be delivered to the reactive element, wherein the amount of incremental charge delivered to the reactive load is a function of an amount of time the first switching device is activated.

18. The method of claim 17 wherein the reactive load is a piezoelectric actuator.

19. The method of claim 17 wherein the at least one reactive element is an inductor.

20. The method of claim 17 wherein the resonant circuit is a second order circuit.

21. The method of claim 17 wherein the resonant circuit further comprises rectifying elements that prevent reverse current flow from the reactive load.

22. The method of claim 17 wherein the first switching device is activated for a time interval that provides incremental charge transfer from the voltage source to the reactive load.

23. The method of claim 17 wherein the drive circuit further comprises a second switching device disposed between the resonant circuit and an energy storage element, and further comprising the step of discharging at least part of the charge stored in the reactive load into the energy storage element by activating the second switching device.

24. The method of claim 23 wherein the energy storage element is maintained at a bias voltage.

25. The method of claim 24 wherein the energy storage element is a storage capacitor of the voltage source.

26. The method of claim 23 wherein the first switching device and the second switching device are field effect transistors.

27. The method of claim 1, wherein the voltage source is a fixed voltage source.

28. The method of claim 10, wherein the voltage source is a fixed voltage source.

29. The method of claim 17, wherein the voltage source is a fixed voltage source.

* * * * *